(12) United States Patent
Curtin et al.

(10) Patent No.: US 7,823,108 B2
(45) Date of Patent: *Oct. 26, 2010

(54) CHIP HAVING TIMING ANALYSIS OF PATHS PERFORMED WITHIN THE CHIP DURING THE DESIGN PROCESS

(75) Inventors: James J. Curtin, Fishkill, NY (US); Michael J. Cadigan, Jr., Brewster, NY (US); Edward J. Hughes, Archbald, PA (US); Kevin M. McIlvain, Cold Spring, NY (US); Jose L. Neves, Poughkeepsie, NY (US); Ray Raphy, Poughkeepsie, NY (US); Douglas S. Search, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

This patent is subject to a terminal disclaimer.

(21) Appl. No.: 11/934,995

(22) Filed: Nov. 5, 2007

(65) Prior Publication Data

US 2008/0066036 A1 Mar. 13, 2008

Related U.S. Application Data

(63) Continuation of application No. 11/129,784, filed on May 16, 2005, now Pat. No. 7,356,793, which is a continuation-in-part of application No. 10/890,463, filed on Jul. 12, 2004, now Pat. No. 7,120,888.

(51) Int. Cl.
*G06F 17/50* (2006.01)
*G06F 9/44* (2006.01)
(52) U.S. Cl. .................. 716/6; 716/5; 716/12; 703/14; 703/19

(58) Field of Classification Search ............. 716/5, 716/6, 12; 703/14, 19, 21; 326/38
See application file for complete search history.

(56) References Cited

U.S. PATENT DOCUMENTS 5,095,454 A * 3/1992 Huang .................. 703/19

(Continued)

FOREIGN PATENT DOCUMENTS

| JP | 2000011680 A | 1/2000 |
|---|---|---|
| JP | 2002245110 A | 8/2002 |

OTHER PUBLICATIONS

Ferrandi et al., "Symbolic Optimization of Interacting Controllers Based on Redundancy Identification and Removal", IEEE Transactions on Computer-Aided Design of Integrated Circuits and Systems, vol. 19, No. 7, Jul. 2000, pp. 760-772.

(Continued)

*Primary Examiner*—Helen Rossoshek
(74) *Attorney, Agent, or Firm*—Cantor Colburn LLP; William Kinnaman, Jr.

(57) ABSTRACT

An integrated circuit chip is made using Genie, a described computer chip design tool which can analyze the data contained within an entire endpoint report, compute relationships between paths based on shared segments, and display this information graphically to the designer. Specifically, Genie groups failing paths into Timing Islands. A timing island is a group of paths which contain at least one shared segment. The most frequently shared segment is sifted to the top of the priority list for each island, and is labeled as the Hub. Thinking of timing islands as a tree, the hub of the island would be the trunk. If you chop the tree down by the trunk, all of the branches, limbs and twigs will fall down too. This is analogous to fixing the timing failures in the hub, and the fix trickling out to each of the segments that dangle off the hub.

17 Claims, 2 Drawing Sheets

U.S. PATENT DOCUMENTS

| | | | |
|---|---|---|---|
| 5,218,551 A | 6/1993 | Agrawal et al. | |
| 5,220,512 A | 6/1993 | Watkins et al. | |
| 5,237,514 A | 8/1993 | Curtin | |
| 5,521,837 A | 5/1996 | Frankle et al. | |
| 5,555,188 A | 9/1996 | Chakradhar | |
| 5,587,919 A | 12/1996 | Cheng et al. | |
| 5,608,645 A | 3/1997 | Spyrou | |
| 5,636,372 A | 6/1997 | Hathaway et al. | |
| 5,663,888 A | 9/1997 | Chakradhar | |
| 5,719,783 A * | 2/1998 | Kerzman et al. | 716/6 |
| 5,790,435 A | 8/1998 | Lewis et al. | |
| 6,086,631 A | 7/2000 | Chaudhary et al. | |
| 6,099,583 A | 8/2000 | Nag | |
| 6,209,123 B1 | 3/2001 | Maziasz et al. | |
| 6,233,724 B1 | 5/2001 | LaBerge | |
| 6,292,926 B1 | 9/2001 | Fukui et al. | |
| 6,397,170 B1 | 5/2002 | Dean et al. | |
| 6,470,482 B1 | 10/2002 | Rostoker et al. | |
| 6,507,937 B1 | 1/2003 | Tetelbaum | |
| 6,598,209 B1 | 7/2003 | Sokolov | |
| 6,601,226 B1 | 7/2003 | Hill et al. | |
| 6,643,683 B1 | 11/2003 | Drumm et al. | |
| 6,836,753 B1 | 12/2004 | Silve | |
| 6,915,249 B1 * | 7/2005 | Sato et al. | 703/14 |
| 6,944,840 B2 | 9/2005 | Sasaki et al. | |
| 6,952,816 B2 | 10/2005 | Gupta et al. | |
| 7,000,210 B2 | 2/2006 | Wu et al. | |
| 7,013,445 B1 | 3/2006 | Teig et al. | |
| 7,117,466 B2 | 10/2006 | Kalafala et al. | |
| 7,139,992 B2 * | 11/2006 | Xing et al. | 716/12 |
| 7,274,208 B2 * | 9/2007 | DeHon et al. | 326/38 |
| 7,356,793 B2 * | 4/2008 | Curtin et al. | 716/6 |
| 7,421,674 B2 * | 9/2008 | Nishida | 716/6 |
| 2002/0013933 A1 | 1/2002 | Shiba | |
| 2003/0144828 A1 * | 7/2003 | Lin | 703/21 |
| 2003/0145294 A1 * | 7/2003 | Ward et al. | 716/5 |
| 2003/0159118 A1 | 8/2003 | Lindkvist | |
| 2003/0229865 A1 | 12/2003 | Bakarian et al. | |
| 2004/0068708 A1 | 4/2004 | Sivaraman et al. | |
| 2004/0153988 A1 | 8/2004 | Ito et al. | |
| 2004/0205681 A1 | 10/2004 | Nozuyama | |
| 2005/0034091 A1 | 2/2005 | Harn | |
| 2005/0066297 A1 | 3/2005 | Kalafala et al. | |
| 2005/0088887 A1 | 4/2005 | Wang | |
| 2005/0262463 A1 | 11/2005 | Cohn et al. | |
| 2006/0010413 A1 | 1/2006 | Curtin et al. | |
| 2006/0190885 A1 * | 8/2006 | Ohkubo | 716/6 |
| 2006/0259885 A1 | 11/2006 | Mortensen et al. | |
| 2008/0052655 A1 * | 2/2008 | Curtin et al. | 716/6 |
| 2009/0119630 A1 * | 5/2009 | Binder et al. | 716/6 |
| 2009/0132983 A1 * | 5/2009 | Gass et al. | 716/6 |

OTHER PUBLICATIONS

Chuang et al., "Timing and Area Optimization for Standard-Cell VLSI Circuit Design", IEEE Transactions On Computer-Aided Design Of Integrated Circuits and Systems, vol. 14, No. 3, Mar. 1995, pp. 308-320.

NB82081720, "I/O Pin Assignment in a Computer", IBM Technical Disclosure Bulletin, vol. 25, No. 3B, Aug. 1, 1982, pp. 1720-1724 (6 pages).

Xi et al., "Useful-Skew Clock Routing With Gate Sizing for Low Power Design", Proceedings of 33rd Design Automation Conference, Jun. 3, 1996, pp. 383-388.

* cited by examiner

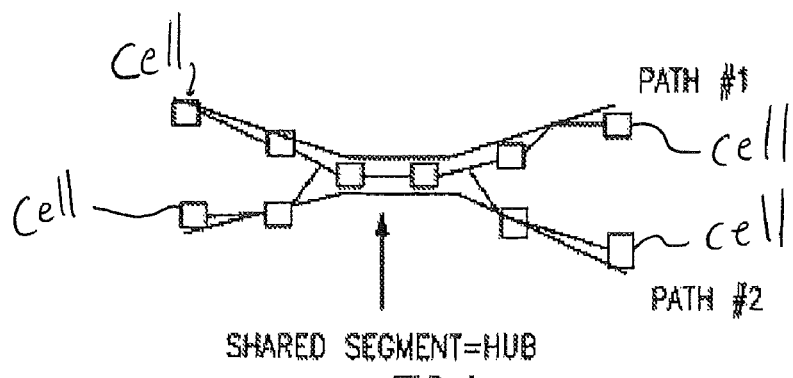

SHARED SEGMENT=HUB
FIG.1

TIMING OPTIMIZED VIM

CONNECTIVITY IS EASY TO
DETERMINE BY SELECTING L1 AND
THEN SELECTING ITS ATTACHED NETS.

PLACEMENT OPTIMIZED VIM

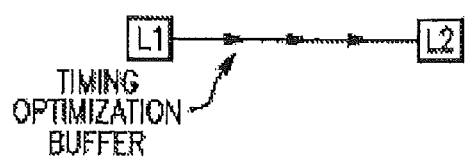

TIMING
OPTIMIZATION
BUFFER

CONNECTIVITY TO IMPORTANT POINTS
IS HARD TO GET. MUST CLICK L1,
DISPLAY ALL CONNECTED NETS, AND
THE REPEAT THIS PROCESS UNTIL THE
PATH IS TRACED TO L2.

FIG.3

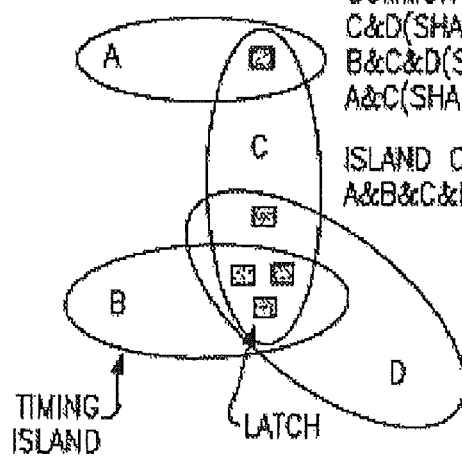

COMMON CELL ISLAND GROUPS:
C&D(SHARE4)
B&C&D(SHARE3)
A&C(SHARE1)

ISLAND CHAINS
A&B&C&D

FIG.4

TIMING
ISLAND    LATCH

CHIP HAVING TIMING ANALYSIS OF PATHS PERFORMED WITHIN THE CHIP DURING THE DESIGN PROCESS

This application is a continuation of U.S. Ser. No. 11/129,784 filed May 16, 2005, now U.S. Pat. No. 7,356,793, which in turn is a continuation in part of U.S. application Ser. No. 10/890,463, filed Jul. 12, 2004, now U.S. Pat. No. 7,120,888, and entitled "Method, System and Storage Medium for Determining Circuit Placement" by James Curtin et al., and contains subject matter which is related to the subject matter of the following applications, each of which is assigned to the same assignee as this application, International Business Machine Corporation of Armonk, N.Y. Each of the below listed applications is hereby incorporated herein by reference in its entirety:

U.S. application Ser. No. 11/129,786, now U.S. Pat. No. 7,290,233, filed May 16, 2005 concurrently herewith and entitled "A method for netlist path characteristics extraction"

U.S. application Ser. No. 11/129,785, now U.S. Pat. No. 7,305,644, filed May 1, 2005 concurrently herewith and entitled "Negative Slack Recoverability Factor—A net weight to enhance timing closure behavior"

TRADEMARKS

IBM® is a registered trademark of International Business Machines Corporation, Armonk, N.Y., U.S.A. and other names used herein may be registered trademarks, trademarks or product names of International Business Machines Corporation or other companies.

BACKGROUND OF THE INVENTION

1. Field of the Invention

This invention relates to chip circuit design, and particularly a chip made using a tool for integrated circuit design, one which can analyze the data contained within an entire endpoint report, compute relationships between paths based on shared segments, and display this information graphically to the designer.

2. Description of Background

When performing timing analysis of paths within chips there often are many hundreds or thousands of paths which fail to meet timing requirements. Many of those failing paths can be related in that a few common segments within them are causing timing failures, and all the test of the connections within the paths are very close to or meet timing. Unfortunately, a tool does not exist which can find the commonality in failing paths.

Commonly, these paths are reported to users in the form of an Endpoint Report. The Endpoint report is a text based file which contains detailed descriptions of timing test failures. Endpoint reports are very lengthy and verbose, requiring users to scroll horizontally and vertically. They do not group related paths nor identify the overlapping segments within them. There is a lot of information in an endpoint report; so much that often there is too much information for an engineer to comprehend.

One known solution to the problem of having too much information can be found in the Critical Path Chart. This is a chart that graphically represents paths using multiple colors and bars of different length representing logic and wire delay. However, the critical path chart cannot find relationships between failing paths. The graphical representation can hint at the relationships, but the critical path chart does not definitively describe the commonality between them.

A tool is needed which can condense many thousands of failing paths into a concise format which identifies repetition/commonality amongst those paths. Such a tool will save design engineers a lot of time in fixing timing problems by providing insight and priorities for fixing negative slack timing test failures.

SUMMARY OF THE INVENTION

The shortcomings of the prior art are overcome and additional advantages are provided by a chip made through the provision of the tool we call Genie which is a tool which can analyze the data contained within an entire endpoint report, compute relationships between paths based on shared segments, and display this information graphically to the designer. Specifically, Genie groups failing paths into Timing Islands. A timing island is a group of paths which contain at least one shared segment. The most frequently shared segment is sifted to the top of the priority list for each island, and is labeled as the Hub. Thinking of timing islands as a tree, the hub of the island would be the trunk. If you chop the tree down by the trunk, all of the branches, limbs and twigs will fall down too. This is analogous to fixing the timing failures in the hub, and the fix trickling out to each of the segments that dangle off the hub.

Previously, using only endpoint reports or the critical path chart, users would not be able to easily identify the hub, and would spend days and weeks manually investigating individual paths. Users would often cull only the worst 500 or so failing paths and ignore the rest (perhaps thousands) because there was too much information to handle.

Our system during setup allows the user to maker a choice between late mode and early mode for the Endpoint report and the tests they would like to run.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates one example of the application of the preferred embodiment where a timing island is a group of failing timing paths that contain at least one shared segment or hub.

FIG. 3 illustrates a timing optimized VIM (VIM=VLSI Integrated Model) and a placement optimized VIM.

FIG. 4 illustrated the interrelationship of timing islands showing shared cells. A cell is a logic device or element such as a latch, AND gate, SRAM, etc.

Figure 2:
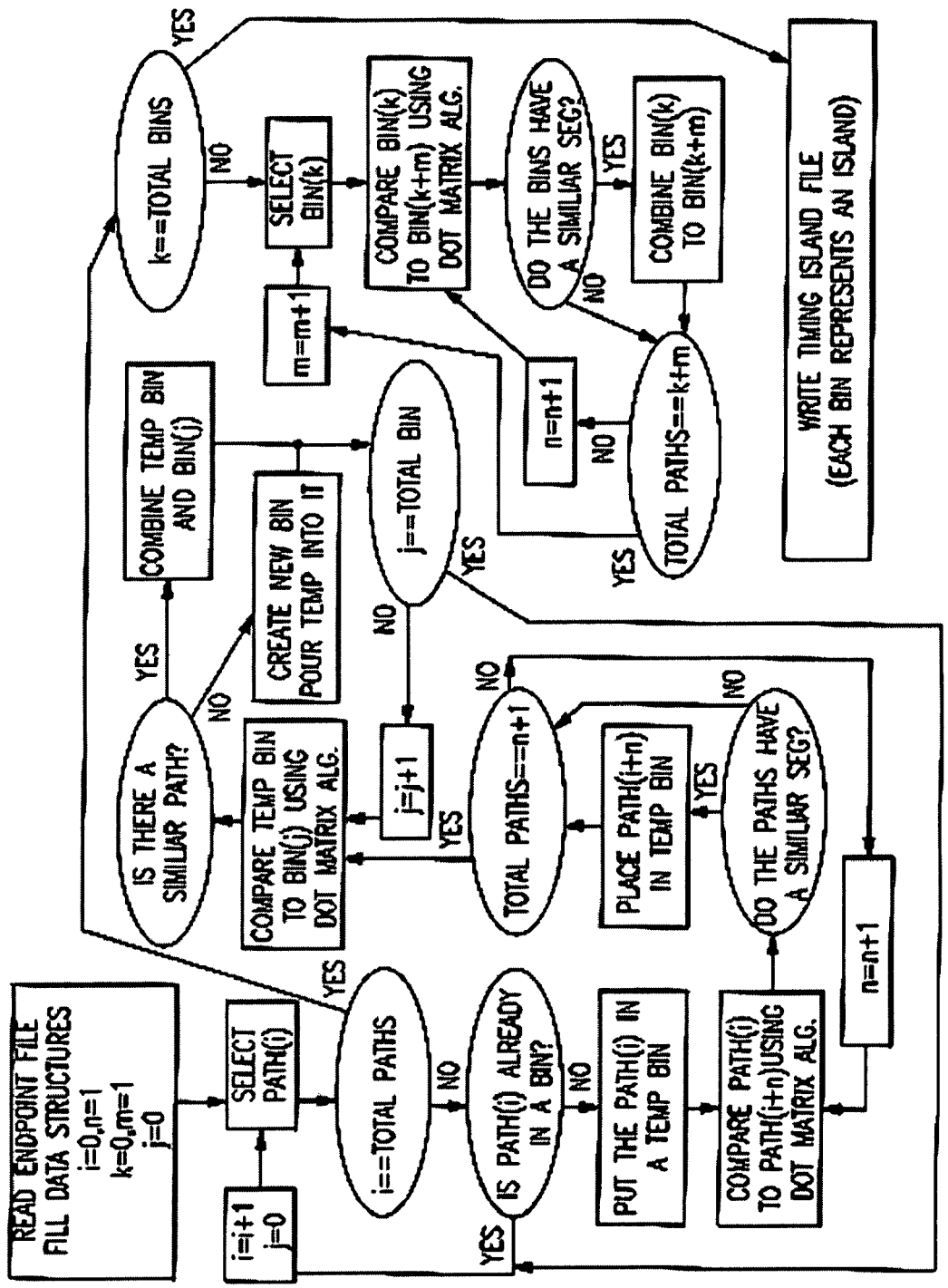
FIG. 2 illustrates an example of a preferred timing path flowchart for generating a timing island file which represents the islands.

The detailed description explains the preferred embodiments of the invention, together with advantages and features, by way of example with reference to the drawings.

DETAILED DESCRIPTION OF THE INVENTION

When performing late mode timing analysis of paths within chips, those paths which cannot meet timing art labeled as having a negative slack—their signals propagate too slowly causing data to arrive late. Often there are many hundreds or thousands of paths which fail to meet timing requirements. Many of those failing paths can be related in that a few common segments within them are causing timing failures, and all of the rest of the connections within the paths are very close to or meet timing. Unfortunately, a tool does not exist which can find the commonality in failing paths.

Commonly, these paths are reported to users in the form of an Endpoint Report. The Endpoint report is a text based file which contains detailed descriptions of timing failures. Endpoint reports are very lengthy and verbose, requiring users to scroll horizontally and vertically. They do not group related paths nor identify the overlapping segments within them. There is a lot of information in an endpoint report; so much that often there is too much information for an engineer to comprehend.

One known solution to the problem of having too much information can be found in the Critical Path Chart. This is a chart that graphically represents paths using multiple colors and bars of different length representing logic and wire delay. However, the critical path chart cannot find relationships between failing paths. The graphical representation can hint at the relationships, but the critical path chart does not definitively describe the commonality between them.

A tool is needed which can condense many thousands of failing paths into a concise format which identifies repetition/commonality amongst those paths. Such a tool will save design engineers a lot of time in fixing timing problems by providing insight and priorities for fixing negative slack timing test failures.

Genie is a tool which can analyze the data contained within an entire endpoint report, compute relationships between paths based on shared segments, and display this information graphically to the designer. Specifically, Genie groups failing paths into Timing Islands. A timing island is a group of paths which contain at least one shared segment. The most frequently shared segment is sifted to the top of the priority list for each island, and is labeled as the Hub. Thinking of timing islands as tree, the hub of the island would be the trunk. If you chop the trunk down by the trunk, all of the branches, limbs and twigs will fall down too. This is analogous to fixing the timing failures in the hub, and the fix trickling out to each of the segments that dangle off the hub.

Previously, using only endpoint reports or the critical path chart, users would not be able to easily identify the hub, and would spend days and weeks manually investigating individual paths. Users would often cull only the worst 500 or so failing paths and ignore the rest (perhaps thousands) because there was too much information to handle.

A significant portion of Genie has already been implemented as software that extends, and is being incorporated into, IBM EDA's ChipBench suite, a preferred chip design tool, using Chipbench: version 10.1 maint 66. First, Genie, as illustrated in FIG. 2, generates a custom endpoint report: this contains only a subset of information available in traditional endpoint reports. The custom report is designed to be interpreted by a computer program, not a human being, and is condensed to keep data processing and storage requirements to a minimum.

Genie processes the custom endpoint report using an abstraction of a DNA sequence alignment algorithm to group timing paths into timing islands. Typically, DNA sequence alignment is used to locate regions of similarity between a query sequence (sequence of unknown function and structure) and other known DNA sequences. These regions of similarity help reveal the homology, genealogy, functionality and structure of the query sequence. Likewise, similar methodology may be used to discover independent timing problems in ASIC designs. Timing paths within an ASIC may be represented as sequences of segments (a segment being a pin to pin connection) instead of sequences of amino acids as with DNA. Like the DNA sequences, the ASIC timing path sequences may be aligned with each other to discover homogenous regions (partial path equalities). The partial path equivalences, which are defined as hubs, tend to be the most likely cause of timing problems and are of high interest to the designer.

Aligning DNA sequences involves comparing the sequences to find a series of characters or patterns that are in the same order in both of the sequences. The two sequences can be written on a page in two rows on top of one another. The objective will be to find the alignment, where the greatest number of identical characters, are in vertical register. Often this involves inserting gaps and aligning mismatched characters. Table 1 shows a small example.

TABLE 1

| (Human alignment of two sequences which happen to be of unequal length) | |
|---|---|
| SEQ1 | VESLCY |
| SEQ2 | VDSCY |
| | VESLCY |
| | VDS-CY |

As seen in Table 1 the two sequences are of unequal length and required the insertion of a gap and left one pair of characters (amino acids E and D) mismatched. This example is representative of a simple DNA sequence alignment.

However, DNA sequences are lengthy and human alignment can be error prone and very time consuming. This created a need to develop alignment algorithms that would reduce time and error. Most alignment algorithms use various forms of matrices. The first algorithm to use the matrix approach was the Dot Matrix algorithm described by Gibbs and McIntyre (1970) which is incorporated herein and is found as Gibbs & McIntyre, 1970 Gibbs, A. J. & McIntyre, G. A. (1970).

The Diagram Method for Comparing Sequences. Its Use with Amino Acid and Nucleotide Sequences.

*Eur. J. Biochem.* 16, 1-11.

This Dot Matrix algorithm has become a standard tool which can quickly determine whether two sequences may have a possible alignment. This algorithm sets up a comparison matrix to determine the sequence similarities. Using the same small sequences as in Table 1, an example of a Dot Matrix algorithm follows in Table 2:

TABLE 2

| | V | E | S | L | C | Y |
|---|---|---|---|---|---|---|
| V | X | | | | | |
| D | | | | | | |
| S | | | X | | | |

TABLE 2-continued

|   | V | E | S | L | C | Y |
|---|---|---|---|---|---|---|
| C |   |   |   |   | X |   |
| Y |   |   |   |   |   | X |

In accordance with the preferred process, first a matrix is set up where each column of the matrix represents a letter of sequence one and each row represents a character of sequence two. Once the matrix is set up, each position of the matrix is marked with an X if both the letter at the top of the column and the beginning of the row are the same. Everywhere an X shows up there is a similarity between the sequences. It is ideal to find long diagonal strings of Xs (CiRi, Ci+1Ri+1 ... Ci+kRi+k where i,k integers>0 and C means column and R means row) as this indicates a possible conserved region (regions of similar function or structure). The longest diagonal in the example is found at C5R4 and continues through C6R5. The completed matrix infers the following alignment illustrated by Table 3.

TABLE 3

V_S_CY

V_S CY

Each _ (underscored space) in the alignment represents a character which was not aligned and each blank between characters which is not underscored represents a gap. Using short sequences as in the above example it is easy to determine what the alignment should be and where the gaps should go.

The problem with this algorithm is the possibility of character repetition in DNA sequences. Just as an example what if the two sequences were VVVVVV and VVVVV. Applying the dot matrix algorithm would cause every location in the matrix to be marked with an X. This is both a downfall and advantage of the Dot Matrix algorithm. Interpreting the resulting matrix may make for a difficult alignment but at the same time, may indicate regions of special interest in the DNA sequence. In order to alleviate the alignment problems due to amino acid repetition the Dot Matrix algorithm evolved into an algorithm which used a unary scoring matrix. Instead of Xs each match was marked with a I and gap penalties we also issued. Yet, unlike a DNA sequence, ASIC timing paths are built of unique segments, where each segment is found only once in the design. Therefore, repetition and substitution are not issues with timing path alignment and an abstraction of the basic Dot Matrix method will be sufficient to perform timing island discovery.

The abstraction on the Dot Matrix algorithm and the concept of timing islands are what make the Genie algorithm unique. In order to properly explain the abstraction, the problem will be restated.

Genie must process a custom report of failing timing paths into a group of timing islands, where a timing island is a group of failing timing paths that contain at least one shared segment (see FIG. 1). So, the preferred embodiment employs key points for the Genie implementation, these are: timing paths need share only one segment to be part of the same island and all path sequences must be compared against each other to properly find exclusive timing islands. These are key differences to the Dot Matrix algorithm. The Dot Matrix Algorithm is designed to fully compare two sequences to find all like amino acid subsequences between two DNA sequences or sometimes executed multiple times to compare a query sequence against a large database of sequences.

The first point, that paths need only share one segment to be members of the same island, may be implemented by modifying the Dot-Matrix algorithm as follows. The example based on Table 2 may be used again by replacing the DNA sequences with timing path sequences (since the sequences in Table 2 are composed of unique elements, the same sequences may represent timing paths). Examining the Table 2 shows a common segment in the comparison of C1R1. This fits the definition of a timing island, thus the two sequences are part of same island. In addition this happens to be the best case performance result since only one compare was needed to determine whether the paths had similarity. The algorithm may stop here and compare the query sequence to the next sequence in the report. Ending the sequence alignment before a complete comparison is part of the abstraction. The worst case performance scenario is two paths that have no commonality. This would cause a full comparison of all segments in each path.

The second point, that all paths must be compared to all other paths may be interpreted as the following. If there are N failing tests, the unmodified Dot Matrix Algorithm must be run N^2 times to ensure the resulting islands are exclusive. As the number of failing paths increases the O(N^2) runtime would increase to levels which may drastically affect usability. This situation has been accounted for in the Genie algorithm. In a situation where the first path in the report has a similar segment to all of the other paths, there would only be one island. Ideally in this situation, the program would stop after the first path has been compared to all paths in the report. Run time for this best case situation is in O(N) time.

In the situation where all paths are exclusive the algorithm would have to compare all paths against each other giving the worst case runtime O(N^2). This is also reduced in the Genie algorithm by instantiating the use of temporary bins to hold intermediate results. These intermediate results are used to gradually define the islands. Placing the intermediate results into bins allows the worst case runtime to be reduced from O(N^2) (all paths are exclusive) to O((N^2+N)/2) and the best case time remains O(N). In effect, the temporary bins help eliminate redundant segment compares and still allows for exclusivity amongst timing islands. FIG. 2 provides a detailed description of the complete Genie timing island generation algorithm.

The Genie Algorithm finishes by writing out a timing island file (formatted contents of the remaining bins). The timing island file will be read by Genie's Graphical User Interface, which displays the timing island information. From the Genie GUI, users are able to see each of the independent timing islands. The GUI allows users to probe into each island to see its comprising segments. Islands are sorted by the worst slack within them, which prioritizes each island by the severity of the timing failures. Segments within islands are sorted by the number of paths they are repeated in, identifying the hub at the top of the list and the "leaves" at the bottom.

Users can select timing islands or segments, or any combination of the two, and display them superimposed upon a placed design layout. Genie allows users to select the color that the island is displayed in, and will draw the hub in a brighter hue than the rest of the segments. This will allow users to visually identify hubs on the layout, and give insight how to fix the timing failure within the hub.

Genie can color fixed (here we mean immobile; constrained by the placement) cells blue along paths it displays. The user can enable and disable this feature easily within the Genie program.

In addition to timing island analysis, Genie provides a slack analysis tool and a net weight display tool. Users can select one or more cells within ChipBench and Genie will display vectors describing the slack pulling on the cell(s). Color is used to represent the amount of slack—red for negative slack; and yellow, orange, and blue for various amounts of positive slack. Genie looks through timing optimization buffer when computing these slacks, therefore the vectors actually point to the next connecting logic device, not to a timing buffer. Designers can use the slack analysis capability to determine if and how cells might be relocated within a placed design to cure timing failures. Genie's net weight display tool is similar to the slack analysis tool in that it draws vectors representing the net weights pulling on selected cells. This information will provide the designer some background information, perhaps explaining why a cell was placed in a particular location.

Looking through timing optimization buffers is a significant feature of the slack analysis and net weight tools. By looking through timing optimization buffers, Genie is essentially comparing two VIM states—the VIM after timing optimization but pre-placement, and the placement-optimized VIM—to compute accurate slacks on a placed design. This capability allows designers to directly see how placement has affected their timing. Buffer look-through allows for the observation of the logic connectivity before placement optimization. Observing this pre-placement optimized connectivity allows users to quickly understand the important point connections within the placement-optimized design. For instance the designer should not care where the timing optimization buffers are placed as long as the path meets it's timing requirements. The FIG. 3 below shows an example of the same path in two VIM states.

Genie solves the problem depicted in the above FIG. 3 by tracing through the buffers and displaying a single vector from L1 to L2. This vector is the representation of the timing optimized VIM connectivity within the placement optimized VIM.

Whereas all of the above features currently exist in Genie, there are several other features which are included in our preferred embodiment. The first is "common cell island groups", in which timing islands sharing one or more common cells will be linked together for display. This function would permit designers to see timing problems stemming from, driving to, or passing through common cells—a type of analysis that does not currently exist. Also, "common cell island chains" link together all timing groups that contain a common timing island, thus connecting the islands into chains based on shared cells. Examples of both common cell island groups and common cell island chains are depicted in FIG. 4.

Next, "incremental buffer strip and rebuild" is a feature which relates to the Genie slack analysis tool. When users move cells, Genie computes slack by looking through the buffers. However, the buffers are still in the placement, which could possibly make the slacks appear to get worse. This new feature will detect a movement, and will strip out and reinsert timing optimization buffers in new locations reflecting the new position of the cell(s). Lastly, Genie will show additional path characteristics. Currently, Genie will color fixed cells blue; with this new feature, cells which have particular syn_ hide keywords and other special attributes will be colored different shades or otherwise displayed differently to the user. This information is already available within ChipBench, but not in this format.

Applications in the synthesis process flow also exist for Genie. For instance, designers can use the grouping capabilities to discover dependencies between cells of logic. Finally, Genie can be used to parallelize timing optimization. That is, a designer can use Genie to isolate timing islands, and dispatch several machines concurrently to attack each respective island. The designer can then pull all of the parallel fixes back together in one final processing pass on a single machine to discover any remaining problems or conflicts.

The capabilities of the present invention can be implemented in software, firmware, hardware or some combination thereof and used to provide a service for use in chip design.

As one example, one or more aspects of the present invention can be included in an tool of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for use in chip design, comprising:
    employing a computer chip design tool for performing late mode timing analysis of paths within chips during a design process with steps comprising:
    commencing with an endpoint report, performing data analysis for condensing a plurality of failing paths into a format which identifies repetition/commonality amongst those failing paths, each path including one or more segments connecting cells; and
    computing relationships between paths analyzed based on shared segments of said identified repetition/commonality, the shared segments being segments belonging to at least two distinct paths, and while computing the relationships grouping failing paths into a group of paths which contain at least one shared segment considered a timing island with timing paths, wherein there are a plurality of shared segments and a most frequently shared segment is sifted to a top of a priority list for each timing island, and is labeled as a hub, and displaying these relationships graphically to a designer.

2. The method according to claim 1, wherein a design correction is made by a tool for performing timing analysis of paths within chips during the design process with steps according to claim 1, with an endpoint report, performing data analysis for condensing many thousands of failing paths into a concise format which identified repetition/commonality among those failing paths, and computing relationships between paths analyzed based on shared segments of said identified repetition/commonality and while computing relationships, grouping failing paths into a group of paths which contain at least one shared segment considered a timing island with timing paths, wherein there are a plurality of shared segments and a most frequently shared segment is sifted to a top of a priority list for each timing island, and is labeled as a hub.

3. The method to claim 2, wherein said timing paths need share only one segment when they are considered part of a same timing island, and all timing path sequences are compared against each other for finding exclusive timing islands.

4. The method according to claim 3, wherein a common segment is a shared segment of two sequences forming part of a same timing island, and only a single common segment is used to determine whether the paths of the common segment have similarity, whereinafter the analysis is performed on a next sequence in the endpoint report.

5. The method according to claim 2, wherein if there are N failing tests, in an instance where a first path in the endpoint report has a similar segment to all of other paths, it is determined that there would only be one island and the analysis is enabled to stop after the first path has been compared to all paths in the report for a Run time for this best case situation in O(N) runtime.

6. The method according to claim 5, wherein when all paths are exclusive and the analysis would have to compare all paths against each other giving a worst case runtime O(N 2), this runtime is reduced by instantiating a use of temporary bins to hold intermediate results and said intermediate results are used to gradually define timing islands to reduce a worst-case runtime to O((N 2+N)/2) while a best case runtime time remains O(N).

7. The method according to claim 2, wherein the tool further completes a run for writing out a timing island file of formatted contents of any remaining bins for timing islands.

8. The method according to claim 7, wherein said timing island file will be read by a tool Graphical User Interface (GUI), which displays timing island information, from which tool GUI users are able to see each of independent timing islands.

9. The method according to claim 8, wherein said tool further comprises a GUI (Graphical User Interface) which allows users to probe into each island to see segments with timing islands are sorted by a worst slack within them, which prioritizes each timing island by a severity of timing failures while segments within timing islands are sorted by a number of paths they are repeated in, identifying a hub at the top of the list and the "leaves" at the bottom of the list, and allowing users to select timing islands or segments, or any combination of the two, and display them superimposed upon a placed design layout, as well as select a color that the island is displayed in, and to draw the hub in a brighter hue than the rest of the segment, enabling users to visually identify hubs on the layout, and give insight how to fix the timing failure within the hub.

10. The method according to claim 2, wherein in addition to timing island analysis, the tool further provides a slack analysis tool allowing users to select one or more cells with a design tool and vectors describing a slack pulling on the cell(s) to be displayed enabling designers to use slack analysis capability to determine if and how cells might be relocated within a placed design to cure timing failures, and wherein the tool further provides a net weight analysis by drawing vectors representing net weights pulling on the selected cells.

11. The method according to claim 2, further including a net weight display tool allowing users to select one or more cells with a design tool and drawing vectors representing net weights pulling on selected cells to provide a designer some background information for explaining why a cell was placed in a particular location.

12. The method according to claim 2, wherein said tool further displays common cell island groups in which timing islands sharing one or more common cells are linked together for display to permit designers to see linked timing which links together all timing islands that share at least one cell.

13. The method according to claim 2, wherein additional path characteristics are displayed by coloring fixed cells blue and enabling cells which have particular keywords and other special attributes to be colored different shades or otherwise displayed differently to a user.

14. The method according to claim 2, wherein said tool further enabling designers to use said grouping to discover dependencies between cells of logic and further enabling designers to parallelize timing optimization, and wherein the tool enables a designer to isolate timing islands, and dispatch several machines concurrently to attack each respective timing island to then pull all of the designers parallel fixes back together, and to combine results of said several machines in one final processing pass on a single machine to discover any remaining problems or conflicts.

15. A method for use in chip design, comprising:
employing a computer chip design tool for performing late mode timing analysis of paths within chips during a design process with steps comprising:
commencing with an endpoint report, performing data analysis for condensing a plurality of failing paths into a format which identifies repetition/commonality amongst those failing paths, each path including one or more segments connecting cells
computing relationships between paths analyzed based on shared segments of said identified repetition/commonality, the shared segments being segments belonging to at least two distinct paths, and while computing the relationships grouping failing paths into a group of paths which contain at least one shared segment considered a timing island with timing paths, wherein there are a plurality of shared segments and a most frequently shared segment is sifted to a top of a priority list for each timing island, and is labeled as a hub, and displaying these relationships graphically to a designer; and
slack analysis and netweight tools for VLSI Integrated Model (VIM) modeling and further including examination of timing optimization buffers for effectively comparing two VIM states, wherein a first VIM state is a state after timing optimization but pre-placement state, and a second VIM state is a placement-optimized VIM state for computing accurate slacks on a placed design, allowing designers to directly see how placement has affected their timing, and said tool further comprises a buffer look-through for allowing for an observation of logic connectivity before placement optimization while observing this pre-placement optimized connectivity, allowing users to quickly understand important point connections within a placement-optimized design.

16. The method according to claim 15, wherein the tool after tracing through said buffer look-through displays a single vector representation of timing optimized VIM state connectivity within placement optimized VIM state.

17. A method for use in chip design, comprising:

employing a computer chip design tool for performing late mode timing analysis of paths within chips during a design process with steps comprising:

commencing with an endpoint report, performing data analysis for condensing a plurality of failing paths into a format which identifies repetition/commonality amongst those failing paths, each path including one or more segments connecting cells; and computing relationships between paths analyzed based on shared segments of said identified repetition/commonality, the shared segments being segments belonging to at least two distinct paths, and while computing the relationships grouping failing paths into a group of paths which contain at least one shared segment considered a timing island with timing paths, wherein there are a plurality of shared segments and a most frequently shared segment is sifted to a top of a priority list for each timing island, and is labeled as a hub, and displaying these relationships graphically to a designer;

an incremental buffer strip and rebuild computation whereby when users move cells, slack is computed by looking through buffers, and if the buffers are still in the placement, which could possibly made the slacks appear to get worse, the rebuild computation will detect a movement, and will strip out and reinsert timing optimization buffers in new locations reflecting new positions of the cell(s).

\* \* \* \* \*